(12) United States Patent
Sato (10) Patent No.: US 9,071,215 B2
(45) Date of Patent: Jun. 30, 2015

(54) AUDIO SIGNAL PROCESSING DEVICE, METHOD, PROGRAM, AND RECORDING MEDIUM FOR PROCESSING AUDIO SIGNAL TO BE REPRODUCED BY PLURALITY OF SPEAKERS

(75) Inventor: Junsei Sato, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 278 days.

(21) Appl. No.: 13/808,167

(22) PCT Filed: Jun. 7, 2011

(86) PCT No.: PCT/JP2011/063043
§ 371 (c)(1),
(2), (4) Date: Jan. 3, 2013

(87) PCT Pub. No.: WO2012/005074
PCT Pub. Date: Jan. 12, 2012

(65) Prior Publication Data
US 2013/0108079 A1 May 2, 2013

(30) Foreign Application Priority Data
Jul. 9, 2010 (JP) ................................ 2010-156787

(51) Int. Cl.
*H04R 3/04* (2006.01)
*H03G 3/30* (2006.01)
(Continued)

(52) U.S. Cl.
CPC .. *H03G 3/20* (2013.01); *H04R 3/04* (2013.01); *H03G 3/3089* (2013.01); *G10L 19/008* (2013.01); *H04S 3/008* (2013.01); *H04S 7/30* (2013.01); *H04S 2400/13* (2013.01);
(Continued)

(58) Field of Classification Search
USPC ......... 381/57, 73.1, 94.7, 102, 104, 107, 317, 381/320, 321
See application file for complete search history.

(56) References Cited

U.S. PATENT DOCUMENTS 5,479,522 A * 12/1995 Lindemann et al. ......... 381/23.1
5,491,754 A 2/1996 Jot et al.
(Continued)

FOREIGN PATENT DOCUMENTS

JP 06-043890 A 2/1994
JP 2006-303799 A 11/2006
(Continued)

OTHER PUBLICATIONS

Official Communication issued in International Patent Application No. PCT/JP2011/063043, mailed on Jul. 5, 2011.

*Primary Examiner* — Brian Miller
(74) *Attorney, Agent, or Firm* — Keating & Bennett, LLP (57) ABSTRACT

An audio signal processing device capable of separating audio signal components which enhance the sence of presense from two channels of audio signals and increasing or decreasing pressure for the components is provided. The audio signal processing device (illustrated as an audio signal processing portion 20) is provided with a signal extraction portion (illustrated as a signal separation and extraction portion 23) for extracting, from input audio signals of two channels, uncorrelated signals derived from the signals; an uncorrelated signal increase/decrease portion (illustrated as gain adjustment portions 25a and 25b) for increasing or decreasing signals extracted at the signal extraction portion; and an audio signal summing portion for summing the signals that have been increased or decreased at the uncorrelated signal increase/decrease portion and the input audio signal.

5 Claims, 8 Drawing Sheets

(51) Int. Cl.
  *H03G 3/20* (2006.01)
  *G10L 19/008* (2013.01)
  *H04S 7/00* (2006.01)
  *G10L 21/0364* (2013.01)
  *H04S 3/00* (2006.01)

(52) U.S. Cl.
  CPC ......... *H04S2420/03* (2013.01); *H04S 2420/13* (2013.01); *H04S 2420/07* (2013.01); *G10L 21/0364* (2013.01)

(56) References Cited

U.S. PATENT DOCUMENTS

| | | | | |
|---|---|---|---|---|
| 6,005,953 | A * | 12/1999 | Stuhlfelner | 381/94.3 |
| 6,195,438 | B1 * | 2/2001 | Yumoto et al. | 381/103 |
| 7,016,501 | B1 * | 3/2006 | Aylward et al. | 381/22 |
| 7,548,854 | B2 * | 6/2009 | Roy et al. | 704/226 |
| 8,238,563 | B2 * | 8/2012 | Rumsey et al. | 381/56 |
| 8,644,521 | B2 * | 2/2014 | Christoph et al. | 381/71.1 |
| 8,660,281 | B2 * | 2/2014 | Bouchard et al. | 381/312 |
| 8,855,322 | B2 * | 10/2014 | Ryu et al. | 381/55 |
| 2007/0242833 | A1 * | 10/2007 | Herre et al. | 381/61 |
| 2008/0260175 | A1 * | 10/2008 | Elko | 381/73.1 |
| 2008/0278622 | A1 * | 11/2008 | Singh et al. | 348/441 |
| 2010/0280824 | A1 * | 11/2010 | Petit et al. | 704/214 |
| 2012/0263322 | A1 * | 10/2012 | Lovitt | 381/119 |

FOREIGN PATENT DOCUMENTS

| | | |
|---|---|---|
| JP | 2007-088568 A | 4/2007 |
| JP | 2007-228033 A | 9/2007 |
| JP | 2008-048324 A | 2/2008 |
| JP | 2009-025500 A | 2/2009 |
| JP | 2009-194877 A | 8/2009 |
| JP | 2011-239036 A | 11/2011 |
| JP | 2011-244196 A | 12/2011 |
| JP | 2011-244197 A | 12/2011 |

* cited by examiner

AUDIO SIGNAL PROCESSING DEVICE, METHOD, PROGRAM, AND RECORDING MEDIUM FOR PROCESSING AUDIO SIGNAL TO BE REPRODUCED BY PLURALITY OF SPEAKERS

TECHNICAL FIELD

The present invention relates to an audio signal processing device, a method, a program, and a recording medium for processing an audio signal to be reproduced by a plurality of speakers.

BACKGROUND OF THE INVENTION

Conventionally, a sound signal processing method has been proposed for enhancing the sense of presence in reproducing music (see Patent Document 1, for example).

In a technology recited in Patent Document 1, a reverberation component is generated artificially and added to increase the proportion of reverberation sound. With this technology, it is possible to enhance the sense of presence by adding reverberation feeling as if heard in a hall, for example, in some music contents.

PRIOR ART DOCUMENT

Patent Document

[Patent Document 1] Japanese Laid-Open Patent Publication No. 6-43890

SUMMARY OF THE INVENTION

Problems to be Solved by the Invention

It is assumed that the technology described in Patent Document 1 is applied to viewing a television program. There are a variety of types of television program contents including not only a music program, but also a sport program, a news program, a drama, a movie, and the like. It is obvious, even from assuming that reverberation sound is added to an outdoor sport, for example, that the sense of presence is not enhanced even if reverberation sound is generated and added to these television program contents. That is, the technology by generating and adding reverberation as represented by Patent Document 1 achieves only an extremely limited effect as means of enhancing the sense of presence in viewing a television program.

Additionally, a sound reproduction system which has been conventionally proposed includes a stereo (2 ch) system, 5.1 ch surround system (ITU-R BS. 775-1), 7.1 ch, 9.1 ch, 22.2 ch, and the like, and the most popular number of channels for audio and musical sound contents at present is that of the 2 ch (stereo) system, and generally, an audio signal of a television content is also provided by stereo (2 ch) in most cases. In addition, an audio signal as a reverberation component and other elements for enhancing the sense of presence are mixed in a stereo audio signal.

The present invention has been devised in view of the above-described circumstances, and an object thereof is to provide an audio signal processing device, a method, a program, and a recording medium capable of separating audio signal components which enhance the sense of presence from audio signals of two channels included in audio or musical sound content recorded in stereo and decreasing or increasing pressure for the components.

Means for Solving the Problem

To solve the above problems, a first technical means of the present invention is an audio signal processing device for increasing or decreasing uncorrelated signals of two channels, comprising: a signal extraction portion for extracting uncorrelated signals from among input audio signals of two channels; an uncorrelated signal increase/decrease portion for increasing or decreasing the uncorrelated signals extracted at the signal extraction portion; and an audio signal addition portion for adding the signals increased or decreased at the uncorrelated signal increase/decrease portion to the input audio signal.

A second technical means of the present invention is the audio signal processing device of the first technical means, further comprising: a user interface for receiving a user operation which changes a degree of increase or decrease at the uncorrelated signal increase/decrease portion; and a parameter control portion for changing a parameter which indicates the degree of increase or decrease according to the user operation received in the user interface.

A third technical means of the present invention is the audio signal processing device of the second technical means, wherein the user interface represents the degree of decrease at the uncorrelated signal increase/decrease portion by a negative value while representing the degree of increase by a positive value.

A fourth technical means of the present invention is an audio signal processing method for increasing or decreasing uncorrelated signals of two channels, comprising: an extraction step of extracting uncorrelated signals from among the input audio signals of two channels by a signal extraction portion; an increase/decrease step of increasing or decreasing the uncorrelated signals extracted at the extraction step by an uncorrelated signal increase/decrease portion; and an addition step of adding the signals increased or decreased at the increase/decrease step to the input audio signal by an audio signal addition portion.

A fifth technical means of the present invention is a program for causing a computer to execute: an extraction step of extracting uncorrelated signals from among input audio signals of two channels; an increase/decrease step of increasing or decreasing the uncorrelated signals extracted at the extraction step; and an addition step of adding the signals increased or decreased at the increase/decrease step to the input audio signal.

A sixth technical means of the present invention is a computer-readable recording medium having the program of the fifth technical means recorded thereon.

Effect of the Invention

According to the present invention, it becomes possible to separate audio signal components which enhance the sense of presence from audio signals of two channels included in an audio or musical sound content recorded in stereo and decreasing or increasing pressure for the components.

PREFERRED EMBODIMENTS OF THE INVENTION

An audio signal processing device according to the present invention is a device for using the fact that signals which has no correlation represent a sense of presence to increase or decrease extracted uncorrelated signals among two audio signals, and allowed to be incorporated in an audio data reproduction apparatus. Note that, an audio signal is, of course, not limited to a so-called signal with recorded audio, and also referred to as an acoustic signal.

Figure 1:
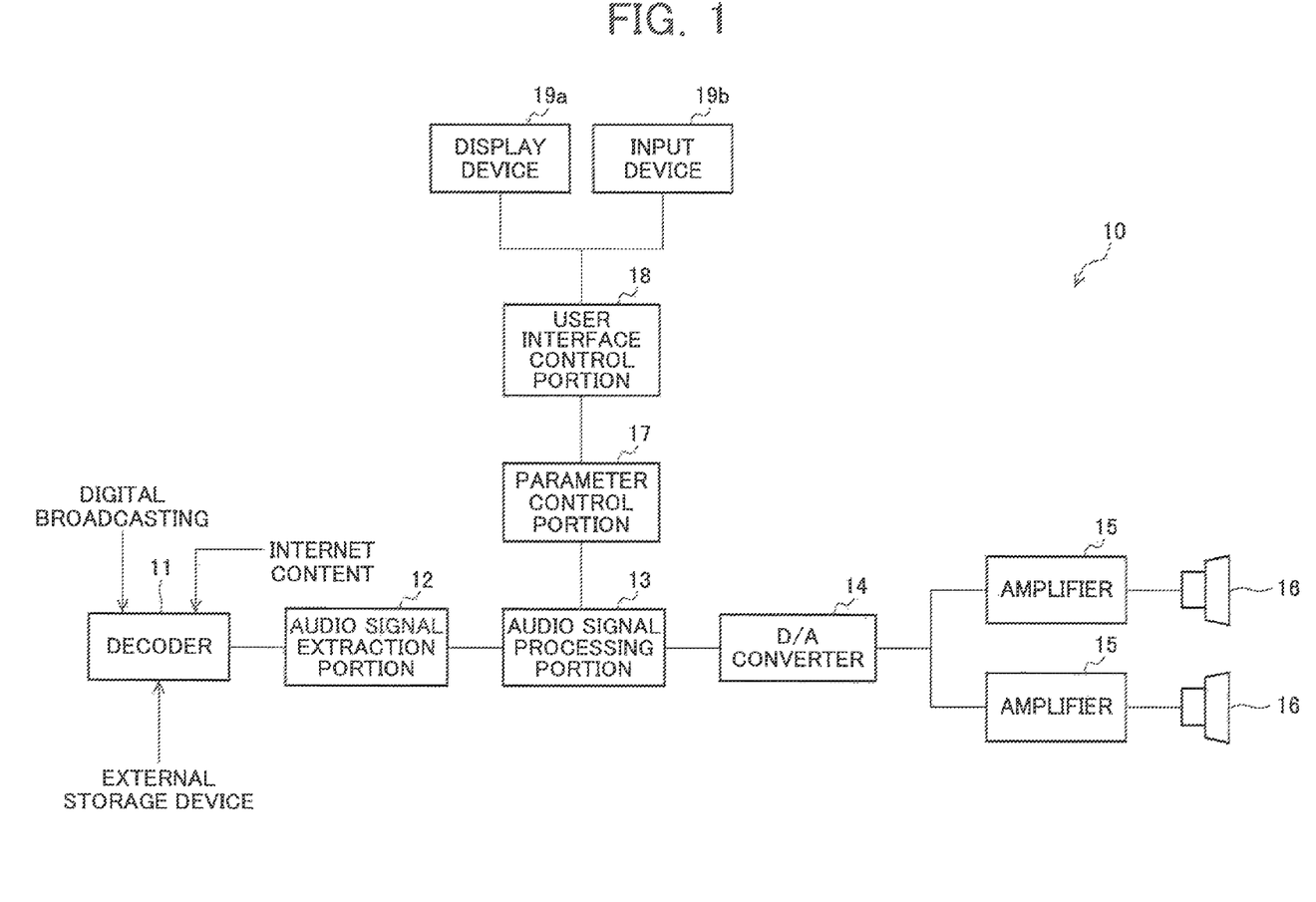
FIG. 1 is a block diagram illustrating a configuration example of an audio data reproduction apparatus provided with an audio signal processing device according to the present invention.
Figure 2:
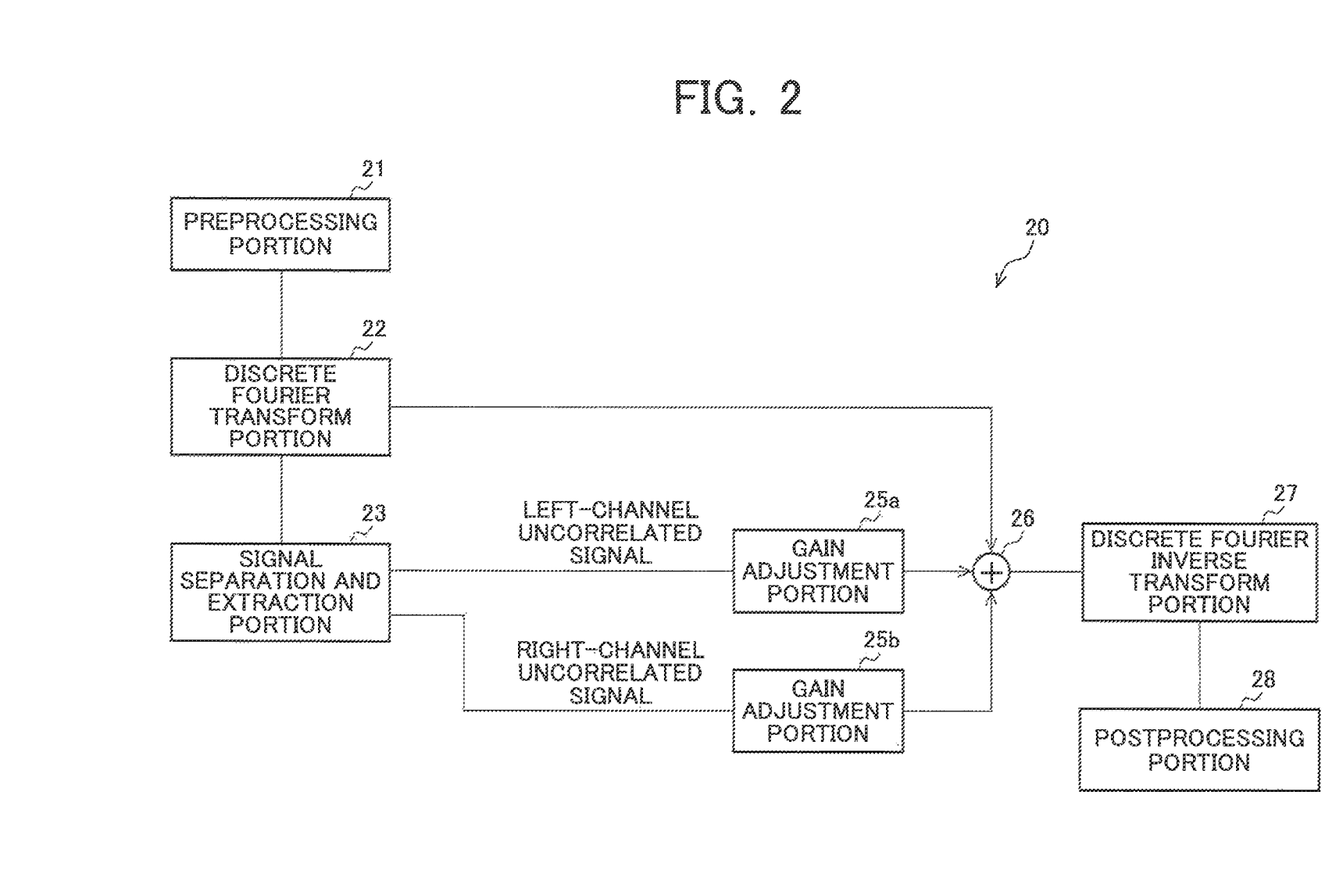
FIG. 2 is a block diagram illustrating a configuration example of an audio signal processing portion in the audio data reproduction apparatus of FIG. 1.
Figure 3:
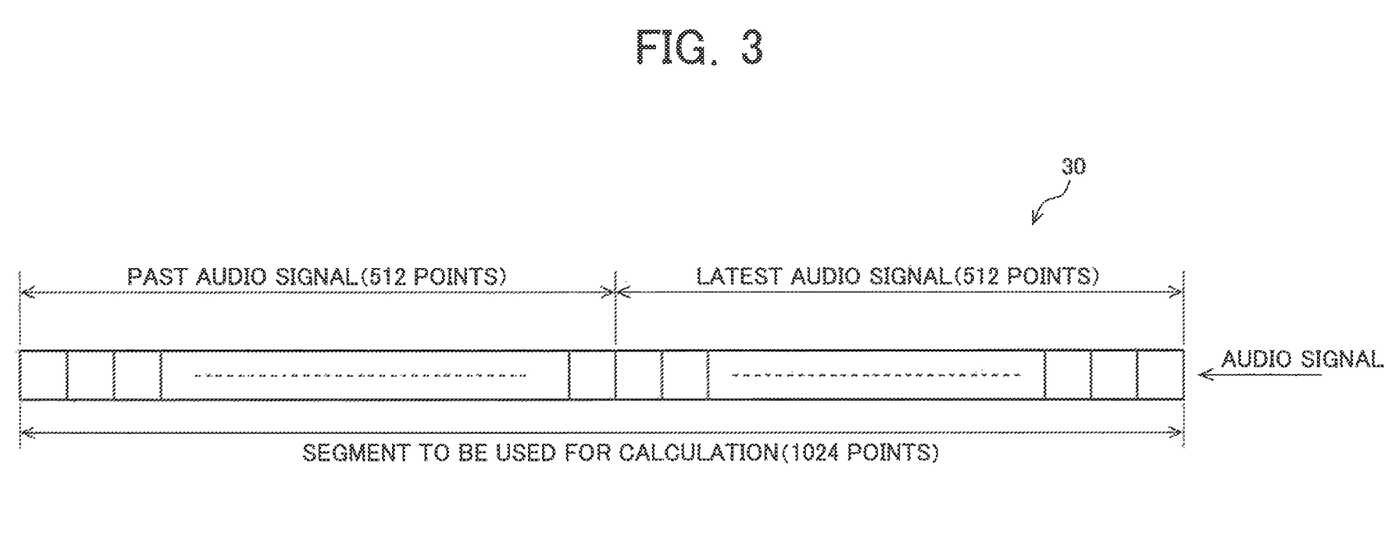
FIG. 3 is a diagram illustrating a state where audio data is stored in a buffer in the audio signal processing portion of FIG. 2.

Hereinafter, description will be given for configuration examples and processing examples of the audio signal processing device according to the present invention with reference to drawings. FIG. 1 is a block diagram illustrating a configuration example of an audio data reproduction apparatus provided with the audio signal processing device according to the present invention, and FIG. 2 is a block diagram illustrating a configuration example of an audio signal processing portion in the audio data reproduction apparatus of FIG. 1. Further, FIG. 3 is a diagram illustrating a state where audio data is stored in a buffer in the audio signal processing portion of FIG. 2.

An audio data reproduction apparatus 10 exemplified in FIG. 1 is comprised of a decoder 11, an audio signal extraction portion 12, an audio signal processing portion 13, a D/A converter 14, amplifiers 15, speakers 16, a parameter control portion 17, a user interface control portion 18, a display device 19a, and an input device 19b. The audio signal processing device according to the present invention is mainly comprised of the audio signal processing portion 13, and provided with, as a preferred configuration example, the parameter control portion 17, the user interface control portion 18, the display device 19a and the input device 19b.

The decoder 11 decodes a content only with sound or a content of a video image with sound to be converted into a form for allowing signal processing and outputs to the audio signal extraction portion 12. The content is a digital broadcasting content transmitted from a broadcast station, or obtained by download from a server distributing a digital content via a network through the Internet, or read from a recoding medium of an external storage device or the like. In this manner, the audio data reproduction apparatus 10 is provided with a digital content input portion for inputting a digital content including a multichannel input audio signal, which is not illustrated in FIG. 1. The decoder 11 decodes a digital content input in the portion. The audio signal extraction portion 12 separates and extracts an audio signal from obtained signals, which is assumingly a 2 ch stereo signal in this case. The signals for two channels are output to the audio signal processing portion 13.

At the user interface control portion 18, an input signal input by a mouse, a keyboard, a remote controller, a touch panel, a button operation or the like as the input device 19b, is obtained via a GUI (Graphical User Interface) displayed on the display device 19a by a user, for example, to be output to the parameter control portion 17. At the parameter control portion 17, the input signals are converted into a parameter group related to processing at the audio signal processing portion 13 to be output to the audio signal processing portion 13.

At the audio signal processing portion 13, an uncorrelated signal is extracted from a two-channel signal, and a degree of increasing pressure or decreasing pressure (suppression) of the uncorrelated signal is adjusted using a parameter input from the parameter control portion 17. Note that, the degree of increasing pressure (or decreasing pressure) is referred to as a degree for increasing (or decreasing) an uncorrelated signal.

Additionally, (I) an original input audio signal may be added to an audio signal obtained as a result of execution of increasing pressure or decreasing pressure for an uncorrelated signal to be output to the D/A converter 14. As the same processing, (II) a signal remained by extraction (separation) (that is, a correlated signal) may be added to the audio signal obtained as a result of execution of increasing pressure or decreasing pressure for an uncorrelated signal so as to be output to the D/A converter 14. Further, as the same processing, (III) an original input audio signal may be added to the audio signal with pressure to be increased or decreased (with increased pressure or decreased pressure) for an uncorrelated signal to be output to the D/A converter 14.

In the above-described example (I), the pressure may be increased or decreased in consideration of an uncorrelated signal originally included in the input audio signal to be added. Description below will be given for an example employing the above-described processing (I), however, in all the processing of the above-described (I) to (III), increased pressure or suppression is reflected on an original input audio signal, and it can be said that there is only a difference in values of parameters, thus meaning the same processing.

At the D/A converter 14, the obtained signal is converted into an analog signal, and right and left signals are output to the amplifier 15, respectively. In each amplifier 15, the input analog signal is amplified in sound to be transmitted to each speaker 16, and output as sound in space from each speaker 16.

The detailed configuration of the audio signal processing portion 13 in FIG. 1 will be described with reference to FIG. 2. The audio signal processing device according to the present invention is a device for increasing or decreasing uncorrelated signals of two channels. Therefore, the audio signal processing device (exemplified by an audio signal processing portion 20) according to the present invention is provided with a signal extraction portion and an uncorrelated signal increase/decrease portion described below. The audio signal processing portion 20 exemplified in FIG. 2 is comprised of a preprocessing portion 21, a discrete Fourier transform portion 22, a signal separation and extraction portion 23, gain adjustment portions 25a and 25b, a synthesizing portion 26, a discrete Fourier inverse transform portion (inverse discrete Fourier transform portion) 27, and a postprocessing portion 28.

At the preprocessing portion 21, audio data is read for performing window function calculation. At the discrete Fourier transform portion 22, the signal is converted from representation of a time domain to representation of a frequency domain. The signal extraction portion described above is a part for separating uncorrelated signals between two channels from input audio signals of two channels and also referred to as an uncorrelated signal extraction portion, which is able to be exemplified by the signal separation and extraction portion 23. At the signal separation and extraction portion 23, audio signals are separated into correlated signals and uncorrelated signals to be separated from right and left channels, respectively. The gain adjustment portions 25a and 25b perform scaling processing (gain factor multiplication processing) for each of a left-channel uncorrelated signal and a right-channel uncorrelated signal. In this example, the gain adjustment portions 25a and 25b output a result of increase or decrease. The gain adjustment portions 25a and 25b are indicated as an example of the uncorrelated signal increase/decrease portion described above.

The synthesizing portion 26 synthesizes all the output from the gain adjustment portions 25a and 25b and the discrete Fourier transform portion 22 for each channel for outputting to the discrete Fourier inverse transform portion 27 as a signal after reallocated for each channel. Note that, the synthesizing portion 26 is also referred to as an addition portion or a superimposing portion because three audio signals are subjected to addition processing (that is, superimposing processing). The discrete Fourier inverse transform portion 27 returns the input and scaled audio signal to the time domain again for outputting to the postprocessing portion 28. At the postprocessing portion 28, the signal is subjected to noise removal to be output to the D/A converter 14 of FIG. 1.

Hereinafter, description will be given for a concrete processing example concerning each portion in the audio signal processing portion 20.

First, the preprocessing portion 21 reads audio data with a length half a segment from the audio signal extraction portion 12 in FIG. 1. In this case, the audio data is referred to as discrete audio signal waveform of two channels sampled at a sampled frequency such as 48 kHz, for example. Additionally, the segment is an audio data section composed of a sample point group with a certain length, and refers herein to a section length intended for discrete Fourier transform at a subsequent step. The value is assumingly provided as 1024, for example. In this example, audio data of 512 points as the length half the segment is a target for reading.

The read audio data of 512 points is stored in a buffer 30 as exemplified in FIG. 3. The buffer is configured to hold an audio signal waveform for a last segment, in which segments prior to the last segment are discarded. Data of a last half segment is linked to data of a latest half segment to create audio data of one segment, and window function calculation is performed for a signal thereof. That is, all the sample data are read twice in the window function calculation.

In the window function calculation, the audio data of one segment is multiplied by the following Hann window which has been conventionally suggested.

[Formula 1]

$$w(m) = \sin^2\left(\frac{m}{M}\pi\right) \quad (0 \leq m < M) \quad (1)$$

In the formula, m is a natural number and M is an even number having a one-segment length. Where, input signals in stereo are $x_L(m)$ and $x_R(m)$, respectively, audio signals $x'_L(m)$ and $x'_R(m)$ after window function multiplication are calculated as:

$$x'_L(m) = w(m)x_R(m),$$

$$x'_R(m) = w(m)x_R(m) \quad (2)$$

In a case where the Hann window is used, for example, an input signal $x_L(m_0)$ of a sample point $m_0$ (where $M/2 \leq m_0 < M$) is multiplied by $\sin^2((m_0/M)\pi)$. Then, the same sample point is read as $m_0 - M/2$ in next reading, thus multiplied by:

[Formula 2]

$$\sin^2\left(\frac{m_0 - M/2}{M}\pi\right) = \sin^2\left(\frac{m_0}{M}\pi - \frac{1}{2}\pi\right) = \cos^2\left(\frac{m_0}{M}\pi\right)$$

In the formula, because of $\sin^2((m_0/M)\pi) + \cos^2((m_0/M)\pi) = 1$, in a case where a signal read without adding any modification is added by a shifted half segment, an original signal is completely restored.

Description will be given for the discrete Fourier transform portion 22. At the discrete Fourier transform portion 22, the audio data obtained in this manner is subjected to discrete Fourier transform as the following formula (3) to obtain audio data in a frequency domain. In the formula, DFT represents discrete Fourier transform, while k is a natural number and $0 \leq k < M$. $X_L(k)$ and $X_R(k)$ are complex numbers.

$$X_L(k) = DFT(x'_L(n)),$$

$$X_R(k) = DFT(x'_R(n)) \quad (3)$$

Next, description will be given for processing at the signal separation and extraction portion 23. First, the obtained audio data in the frequency domain is divided into a subband. As a dividing method, the Equivalent Rectangular Bandwidth (ERB) is used to divide an ERB bandwidth between 0 Hz and a frequency half a sampled frequency. In the method, the number of division by the ERB up to an upper limit $f_{max}$ [Hz] of a given frequency, that is, a maximum value I of an index of each band divided by the ERB is given by the following formula, $$I = \text{floor}(21.4 \log_{10}(0.00437 f_{max} + 1)) \quad (4)$$

where, floor (a) is a floor function and represents a maximum value of an integer not exceeding a real number a.

Then, a center frequency $F_c^{(i)}$ ($1 \leq i \leq I$) [Hz] of each band with ERB width (hereinafter, referred to as a subband) is given by the following formula.

[Formula 3]

$$F_c^{(i)} = \frac{10^{\frac{i}{21.4}} - 1}{4.37} \times 10^3 \quad (5)$$

Further, the ERB bandwidth $b^{(i)}$ [Hz] at the time is obtained by the following formula.

$$b^{(i)} = 24.7(0.00437 F_c^{(i)} + 1) \quad (6)$$

Therefore, boundary frequencies $F_L^{(i)}$ and $F_U^{(i)}$ on both sides of the i-th subband are able to be obtained by shifting by only ERB/2 frequency width from the center frequency to a low-pass side and a high-pass side, respectively. Therefore, in the i-th subband, line spectrums from the $K_L^{(i)}$-th line spectrum to the $K_U^{(i)}$-th line spectrum are included. In this case, $K_L^{(i)}$ and $K_U^{(i)}$ are represented by the following formulas (7) and (8), respectively, $$K_L^{(i)} = \text{ceil}(21.4 \log_{10}(0.00437 F_L^{(i)} + 1)) \quad (7)$$

$$K_U^{(i)} = \text{floor}(21.4 \log_{10}(0.00437 F_U^{(i)} + 1)) \quad (8)$$

where ceil (a) is a ceiling function and represents a minimum value of an integer not becoming smaller than the real number a. Further, a line spectrum after discrete Fourier transform is symmetric with the boundary of M/2 (provided M is an even number) excluding a direct current component, that is, $X_L(0)$, for example. That is, $X_L(k)$ and $X_L(M-k)$ are in relation of complex conjugate in a range of $0<k<M/2$. Accordingly, hereinafter, a range of $K_U^{(i)} \leq M/2$ is considered as a target of analysis, and a range of $k>M/2$ is regarded as with a symmetrical line spectrum in relation of complex conjugate.

Concrete examples of the processing are presented. For example, in a case where a sampled frequency is 48000 Hz, I=49 is obtained, resulting in division into 49 subbands, provided that a direct current component is not intended for division and not included in any subbands. The reason is because normalized correlation coefficients of right and left channels are obtained in the following method, in which the direct current component only has a real part of a complex number and the normalized correlation coefficient is therefore 1, thus resulting in inappropriate processing in which direct current components of right and left channels are all allocated to correlation coefficients. Moreover, line spectrum components corresponding to a frequency further above the highest subband section are also present, however, seldom affect audibility and in addition, these components normally have a slight value thereof, therefore these components can be included in the highest subband section.

Next, in each subband determined in this manner, normalized correlation coefficients of a left channel and a right channel are obtained by the following formula, thereby obtaining correlation coefficients.

[Formula 4]

$$d^{(i)} = \frac{D^{(i)}}{G^{(i)}} \quad (9)$$

$$D^{(i)} = \sum_{k=K_L^{(i)}}^{K_U^{(i)}} |\text{Re}\{X_L(k)\} \cdot \text{Re}\{X_R(k)\}| + |\text{Im}\{X_L(k)\} \cdot \text{Im}\{X_R(k)\}| \quad (10)$$

$$G^{(i)} = \sqrt{P_L^{(i)} P_R^{(i)}} \quad (11)$$

$$P_L^{(i)} = \sum_{k=K_L^{(i)}}^{K_U^{(i)}} |X_L(k)|^2, \quad P_R^{(i)} = \sum_{k=K_L^{(i)}}^{K_U^{(i)}} |X_R(k)|^2 \quad (12)$$

The normalized correlation coefficient $d^{(i)}$ represents how much correlated audio signals of right and left channels are present, and is obtained as the value of an real number between 0 and 1, resulting in 1 in the case of signals exactly the same as each other and 0 in the case of signals absolutely uncorrelated with each other. In the formula, in a case where both electric power $P_L^{(i)}$ and $P_R^{(i)}$ of the audio signals of left and right channels are represented as 0, extraction of a correlated signal and an uncorrelated signal is rendered impossible concerning a subband thereof, thereby moving to processing of a next subband without performing the processing. Further, in a case where either one of $P_L^{(i)}$ and $P_R^{(i)}$ is represented as 0, it is impossible to calculate by the formula (9), however, the normalized correlation coefficient $d^{(i)}=0$ is provided, then continuing processing of the subband.

Next, the signal separation and extraction portion 23 uses the normalized correlation coefficient $d^{(i)}$ to obtain a transformation coefficient for separating and extracting right and left uncorrelated signals from audio signals of right and left channels, and uses each transformation coefficient to separate and extract uncorrelated signals from the audio signals of right and left channels. All the uncorrelated signals may be extracted as estimated audio signals.

In this case, each signal of right and left channels is comprised of an uncorrelated signal and a correlated signal, and a model that the same signal is assumingly output from either side is employed for the correlated signal. Additionally, an audio image synthesized by the correlated signals output from either side assumingly has a direction determined by balance of sound pressure between right and left of the correlated signals. In accordance with the model, input signals $x_L(n)$ and $x_R(n)$ are represented as:

$$x_L(m) = s(m) + n_L(m)$$

$$x_R(m) = \alpha s(m) + n_R(m) \quad (13)$$

where s(m) is a correlated signal on right and left side, and $n_L(m)$ is an outcome in which the correlated signal s(m) is subtracted from an audio signal of the left channel and able to be defined as an uncorrelated signal (of the left channel), while $n_R(m)$ is an outcome in which the correlated signal s(m) is subtracted from an audio signal of the right channel and able to be defined as an uncorrelated signal (of the right channel). Further, α is a positive real number representing a level of sound pressure balance between right and left of the correlated signal.

From the formula (13), audio signals $x'_L(m)$ and $x'_R(m)$ after window function multiplication in the formula (2) described above are represented by the following formula (14), provided that s'(m), $n'_L(m)$ and $n'_R(m)$ are products in which s(m), $n_L(m)$ and $n_R(m)$ are multiplied by window function, respectively.

$$x'_L(m) = w(m)\{s(m) + n_L(m)\} = s'(m) + n'_L(m),$$

$$x'_R(m) = w(m)\{\alpha s(m) + n_R(m)\} = \alpha s'(m) + n'_R(m) \quad (14)$$

The formula (14) is subjected to discrete Fourier transform, thereby obtaining the following formula (15), provided that S(k), $N_L(k)$ and $N_R(k)$ are outcomes in which s'(m), $n'_L(m)$ and $n'_R(m)$ are subjected to discrete Fourier transform, respectively.

$$X_L(k) = S(k) + N_L(k),$$

$$X_R(k) = \alpha S(k) + N_R(k) \quad (15)$$

Therefore, audio signals $X_L^{(i)}(k)$ and $X_R^{(i)}(k)$ in the i-th subband are represented as:

$$X_L^{(i)}(k) = S^{(i)}(k) + N_L^{(i)}(k),$$

$$X_R^{(i)}(k) = \alpha^{(i)} S^{(i)}(k) + N_R^{(i)}(k),$$

provided that $K_L^{(i)} \leq k \leq K_U^{(i)}$ \quad (16)

where $\alpha^{(i)}$ represents as α in the i-th subband. Hereinafter, a correlated signal $S^{(i)}(k)$ and uncorrelated signals $N_L^{(i)}(k)$ and $N_R^{(i)}(k)$ in the i-th subband are respectively provided as:

$$S^{(i)}(k) = S(k),$$

$$N_L^{(i)}(k) = N_L(k),$$

$$N_R^{(i)}(k) = N_R(k),$$

provided that $K_L^{(i)} \leq k \leq K_U^{(i)}$ \quad (17)

From the formula (16), sound pressure $P_L^{(i)}$ and $P_R^{(i)}$ of Formula (12) are represented as:

$$P_L^{(i)} = P_S^{(i)} + P_N^{(i)},$$

$$P_R^{(i)} = [\alpha^{(i)}]^2 P_S^{(i)} + P_N^{(i)} \quad (18)$$

where $P_S^{(i)}$ and $P_N^{(i)}$ are electric power of a correlated signal and an uncorrelated signal in the i-th subband, respectively, and represented as:

[Formula 5]

$$P_S^{(i)} = \sum_{k=\kappa_L^{(i)}}^{\kappa_U^{(i)}} |S(k)|^2, \; P_N^{(i)} = \sum_{k=\kappa_L^{(i)}}^{\kappa_U^{(i)}} |N_L(k)|^2 = \sum_{k=\kappa_L^{(i)}}^{\kappa_U^{(i)}} |N_R(k)|^2 \quad (19)$$

assuming that, in the formula, sound pressure of an uncorrelated signal is assumingly the same between the right and the left.

Additionally, from the formulas (10) to (12), the formula (9) is able to be represented as:

[Formula 6]

$$d^{(i)} = \frac{\alpha^{(i)} P_S^{(i)}}{\sqrt{P_L^{(i)} P_R^{(i)}}} \quad (20)$$

assuming that, in the calculation, $S(k)$, $N_L(k)$ and $N_R(k)$ are orthogonal to one another and the multiplied electric power is 0.

The following formula is obtained by solving the formula (18) and the formula (20),

[Formula 7]

$$\alpha^{(i)} = \frac{\beta}{2\gamma}, \; P_S^{(i)} = \frac{2\gamma^2}{\beta}, \; P_N^{(i)} = P_L^{(i)} - P_S^{(i)} = P_L^{(i)} - \frac{2\gamma^2}{\beta} \quad (21)$$

where $\beta$ and $\gamma$ are intermediate variables, and $$\beta = \frac{P_R^{(i)} - P_L^{(i)} + \sqrt{(P_L^{(i)} - P_R^{(i)})^2 + 4P_L^{(i)} P_R^{(i)} [d^{(i)}]^2}}{\sqrt{P_L^{(i)} P_R^{(i)}}}, \gamma = d^{(i)} \quad (22)$$

These values are used to estimate an uncorrelated signal in each subband. In a case where an estimated value $est(N_L^{(i)}(k))$ for an uncorrelated signal $N_L^{(i)}(k)$ of a left channel in the i-th subband is provided, using parameters $\mu_1$ and $\mu_2$, as:

$$est(N_L^{(i)}(k)) = \mu_1 X_L^{(i)}(k) + \mu_2 X_R^{(i)}(k) \quad (23),$$

an estimated error $\epsilon$ is represented as:

$$\epsilon = est(N_L^{(i)}(k)) - N_L^{(i)}(k) \quad (24)$$

where $est(A)$ is represented as an estimated value of A. When a square error $\epsilon^2$ then becomes minimum, in the case of using a property in which $\epsilon$, $X_L^{(i)}(k)$ and $X_R^{(i)}(k)$ are orthogonal, respectively, the following relation is formed.

$$E[\epsilon \cdot X_L^{(i)}(k)] = 0, E[\epsilon \cdot X_R^{(i)}(k)] = 0 \quad (25)$$

When the formulas (16), (19) and (21) to (24) are used, the following simultaneous equation is able to be derived from the formula (25).

$$(\mu_1 + \mu_2 \alpha^{(i)}) P_S^{(i)} + (\mu_1 - 1) P_N^{(i)} = 0$$

$$\alpha^{(i)} (\mu_1 + \mu_2 \alpha^{(i)}) P_S^{(i)} + \mu_2 P_N^{(i)} = 0 \quad (26)$$

Each parameter is obtained as follows by solving the formula (26).

[Formula 8]

$$\mu_1 = \frac{[\alpha^{(i)}]^2 P_S^{(i)} + P_N^{(i)}}{([\alpha^{(i)}]^2 + 1) P_S^{(i)} + P_N^{(i)}}, \; \mu_2 = \frac{-\alpha^{(i)} P_S^{(i)}}{([\alpha^{(i)}]^2 + 1) P_S^{(i)} + P_N^{(i)}} \quad (27)$$

Further, an estimated value $est(N_R^{(i)}(k))$ for an uncorrelated signal $N_R^{(i)}(k)$ of a right channel in the i-th subband is also provided, using parameters $\mu_3$ and $\mu_4$, as:

$$est(N_R^{(i)}(k)) = \mu_3 X_L^{(i)}(k) + \mu_4 X_R^{(i)}(k) \quad (28),$$

and the parameters $\mu_3$ and $\mu_4$ are obtained as follows as with the parameters $\mu_1$ and $\mu_2$.

[Formula 9]

$$\mu_3 = \frac{-\alpha^{(i)} P_S^{(i)}}{([\alpha^{(i)}]^2 + 1) P_S^{(i)} + P_N^{(i)}}, \; \mu_4 = \frac{P_S^{(i)} + P_N^{(i)}}{([\alpha^{(i)}]^2 + 1) P_S^{(i)} + P_N^{(i)}} \quad (29)$$

Where, for estimated values $est(N_L^{(i)}(k))$ and $est(N_R^{(i)}(k))$ obtained in this manner, electric power $P_{est(N)}^{(i)}$ needs to satisfy the following formula obtained by calculating the square of both sides of the formulas (23) and (28).

$$P_{est(N)}^{(i)} = (\mu_1 + \alpha^{(i)} \mu_2)^2 P_S^{(i)} + (\mu_1^2 + \mu_2^2) P_N^{(i)} \quad (30)$$

$$= (\mu_3 + \alpha^{(i)} \mu_4)^2 P_S^{(i)} + (\mu_3^2 + \mu_4^2) P_N^{(i)}$$

And the estimated values are thus subjected to scaling from these formulas as the following formulas. Note that, $est'(A)$ is represented as the estimated value of A subjected to scaling.

[Formula 10]

$$est'(N_L^{(i)}(k)) = \frac{\sqrt{P_N^{(i)}}}{\sqrt{(\mu_1 + \alpha^{(i)} \mu_2)^2 P_S^{(i)} + (\mu_1^2 + \mu_2^2) P_N^{(i)}}} est(N_L^{(i)}(k)) \quad (31)$$

$$est'(N_R^{(i)}(k)) = \frac{\sqrt{P_N^{(i)}}}{\sqrt{(\mu_3 + \alpha^{(i)} \mu_4)^2 P_S^{(i)} + (\mu_3^2 + \mu_4^2) P_N^{(i)}}} est(N_R^{(i)}(k)) \quad (32)$$

As described above, the signal separation and extraction portion 23 uses, as the above-described transformation coefficients, transformation coefficients constituted by each of the parameters $\mu_1$ to $\mu_4$ indicated in the formulas (27) and (29) and scaling coefficients as indicated in the formulas (31) and (32) to perform estimation by calculation (formulas (23) and (28)), thereby separates the uncorrelated signal of the right channel and the uncorrelated signal of the left channel to be output. Specifically describing the output, the signal separation and extraction portion 23 outputs an uncorrelated signal $est'(N_L^{(i)}(k))$ separated from the left channel to the gain adjustment portion 25a for the left channel and outputs an uncorrelated signal $est'(N_R^{(i)}(k))$ separated from the right channel to the gain adjustment portion 25b for the right channel.

The increase/decrease processing at the gain adjustment portions 25a and 25b may be increase/decrease processing based on a default value, but is similar to processing using a parameter which is set based on a user operation by a user interface and understandable by employing a specific example based on a user operation described below, thus omitting the description about increase/decrease processing based on a default value.

Description will hereinafter be given for the case of judging whether an uncorrelated signal is a signal having pressure to be increased or decreased based on a value input by a user instead of a default value as a more preferable example.

Figure 4:
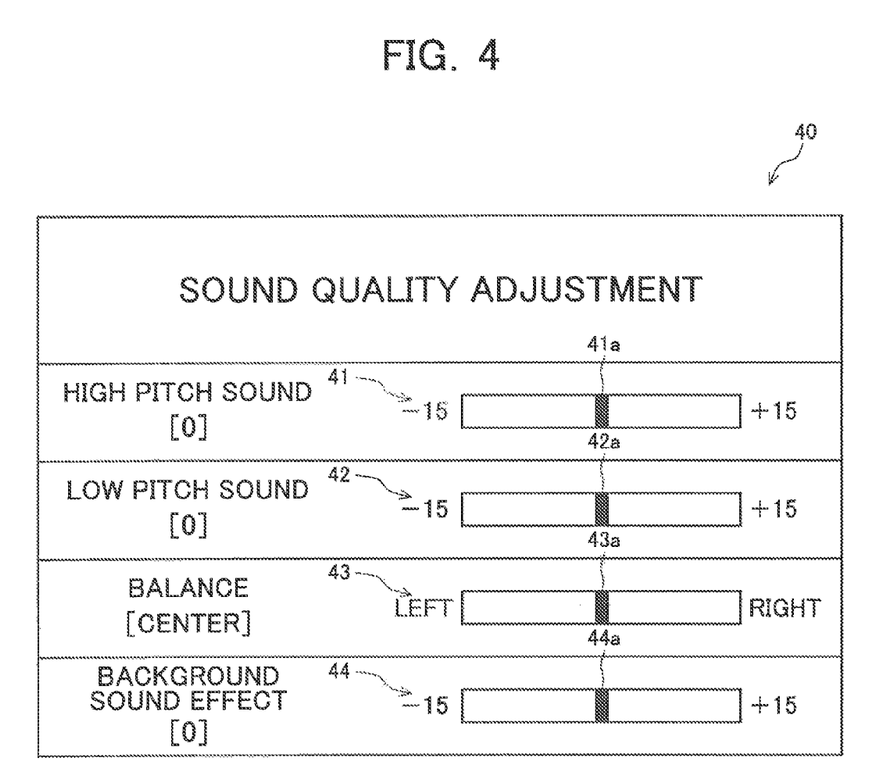
FIG. 4 is a diagram illustrating an example of a graphical user interface (GUI) screen which is displayed on a display device by a user interface control portion of FIG. 1.

First, description will be given in detail for a user interface and the parameter control portion 17 in FIG. 1 with reference to FIG. 4. FIG. 4 is a diagram illustrating an example of a graphical user interface (GUI) screen which is displayed on the display device 19a by the user interface control portion 18 of FIG. 1. A user interface described below is comprised of the display device 19a, the input device 19b, and the user interface control portion 18, in which various processing of the user interface as described below is applied by controlling the display device 19a and/or the input device 19b by the user interface control portion 18.

A GUI screen 40 as exemplified in FIG. 4 shows an example of a screen which is displayed on the display device 19a by the user interface control portion 18. The GUI screen 40 is assumingly displayed, for example, when a user selects an item of sound quality adjustment from a setting menu by operating a remote controller or the like. The GUI screen 40 includes a slider 41 for adjusting high pitch sound, a slider 42 for adjusting low pitch sound, a slider 43 for adjusting right and left balance, and a slider 44 for adjusting increase/decrease of a background sound effect. On each of the sliders 41, 42, 43, and 44, controls for adjustment 41a, 42a, 43a, and 44a are movably displayed, respectively.

A user operates an up or down key of a remote controller or the like to highlight the slider 44 for a background sound effect, and at the time, operates a right or left key of the remote controller or the like in the same way to move the control 44a to right or left. In this example, 31 steps from −15 to 15 are provided as variable steps thereof, and below "Background Sound Effect", a currently set number is displayed. As the number is increased, that is, as the control 44a is moved to the right side, the above-described uncorrelated signal component is increased. On the contrary, as the number is decreased, that is, as the control 44a is moved to the left side, the above-described uncorrelated signal component is decreased.

In this manner, it is preferable for the user interface to represent a degree of decrease at the uncorrelated signal increase/decrease portion by a negative value while representing a degree of increase by a positive value. In the GUI screen 40, although an example also including the sliders 41 to 43 is shown, it may go without these sliders 41 to 43, of course. Additionally, in the slider 44 on the GUI screen 40, although numbers on the right and left sides thereof merely represent the number of stages of adjustment steps, decibel indication or the like may be used.

The value of the control 44a which has been input in this manner is converted to a gain value which is used at the audio signal processing portion 13 (20) for indicating a degree of increase/decrease of an uncorrelated signal. Assuming that the value of the control is r and a gain value after transform is r', the next formula may be employed so that increase/decrease of the control is proportionate to a degree of auditory sound volume, for example. In the formula, κ is a natural number and 15, for example.

[Formula 11]

$$g_N = \begin{cases} 10^{\frac{4(r-\kappa)}{20}} & (0 \le r \le \kappa) \\ -10^{\frac{4(-r-\kappa)}{20}} & (-\kappa \le r < 0) \end{cases} \quad (33)$$

In this manner, $g_N$ is obtained. The parameter control portion 17 calculates, as described above, a parameter which is necessary for the audio signal processing portion 13, to be output to the audio signal processing portion 13.

In the audio signal processing portion 13, signals of right and left channels are generated. Assuming that $g_N$ obtained in the formula (33) is an allocated gain of the uncorrelated signals, output audio signals $Y_L^{(i)}(k)$ and $Y_R^{(i)}(k)$ in the i-th subband are obtained as the following formula.

$$Y_L^{(i)}(k)=X_L^{(i)}(k)+g_N N_L^{(i)}(k)$$

$$Y_R^{(i)}(k)=X_R^{(i)}(k)+g_N N_R^{(i)}(k) \quad (34)$$

As can be seen from the above description, the uncorrelated signals are increased or decreased for audio signals of right and left channels according to the value of the gain $g_N$. When the formula (33) is used, a range of the gain $g_N$ value is $-1 \le g_N \le 1$, thus from the formula (16), each of terms of uncorrelated signal components are provided in ranges of $0 \le g_N N_L^{(i)}(k) \le 2N_L^{(i)}(k)$ or $0 \le g_N N_R^{(i)}(k) \le 2N_R^{(i)}(k)$. In other words, according to the value of a control 54a, it becomes possible to change from a point at which the pressure of an uncorrelated signal is decreased to 0 up to the point at which pressure is increased twice. Note that, in the formula (34), $N_L^{(i)}(k)$ and $N_R^{(i)}(k)$ are included as values in $X_L^{(i)}(k)$ and $X_R^{(i)}(k)$ respectively, which thus become 0 to 2 times.

As described above, reallocation of the uncorrelated signals of right and left channels after pressure increase processing or suppression processing in the i-th subband is performed, which is performed for all the subbands. This reallocation is performed for the left channel by synthesizing at the synthesizing portion 26, a signal allocated by multiplying a gain by a scaling coefficient by the gain adjustment portion 25a and an output signal from a discrete Fourier transform portion 22 which is an original signal of the left channel, while for the right channel by synthesizing at the synthesizing portion 26, a signal allocated by multiplying a gain by a scaling coefficient by the gain adjustment portion 25b and an output signal from the discrete Fourier transform portion 22 which is an original signal of the right channel. As a result, an audio signal for each subband is added for each of the both channels, thereby obtaining output audio signals $Y_L(k)$ and $Y_R(k)$ in a frequency domain for the right and left channels, so that the synthesizing portion 26 outputs these signals to the discrete Fourier inverse transform portion 27.

Then, in the discrete Fourier inverse transform portion 27, each channel is subjected to discrete Fourier inverse transform so that output audio signals $y'_L(m)$ and $y'_R(m)$ in a time domain are obtained. In the formula, $DFT^{-1}$ represents discrete Fourier inverse transform (inverse discrete Fourier transform).

$$y'L(m)=DFT^{-1}(Y_L(k))$$

$$y'R(m)=DFT^{-1}(Y_R(k)) \quad (35)$$

Where, as described in the formula (3), the signal subjected to discrete Fourier transform is a signal after window function multiplication, and thus signals $y'_L(m)$ and $y'_R(m)$ obtained by inverse transform are also provided by multiplication of a window function. The window function is a function as shown in formula (1), and reading is performed by a shifted half-segment length, thus as described above, by a shifted half-segment length from the beginning of a last processed segment to be added to an output buffer, so that data after transform is obtained.

Figure 5:
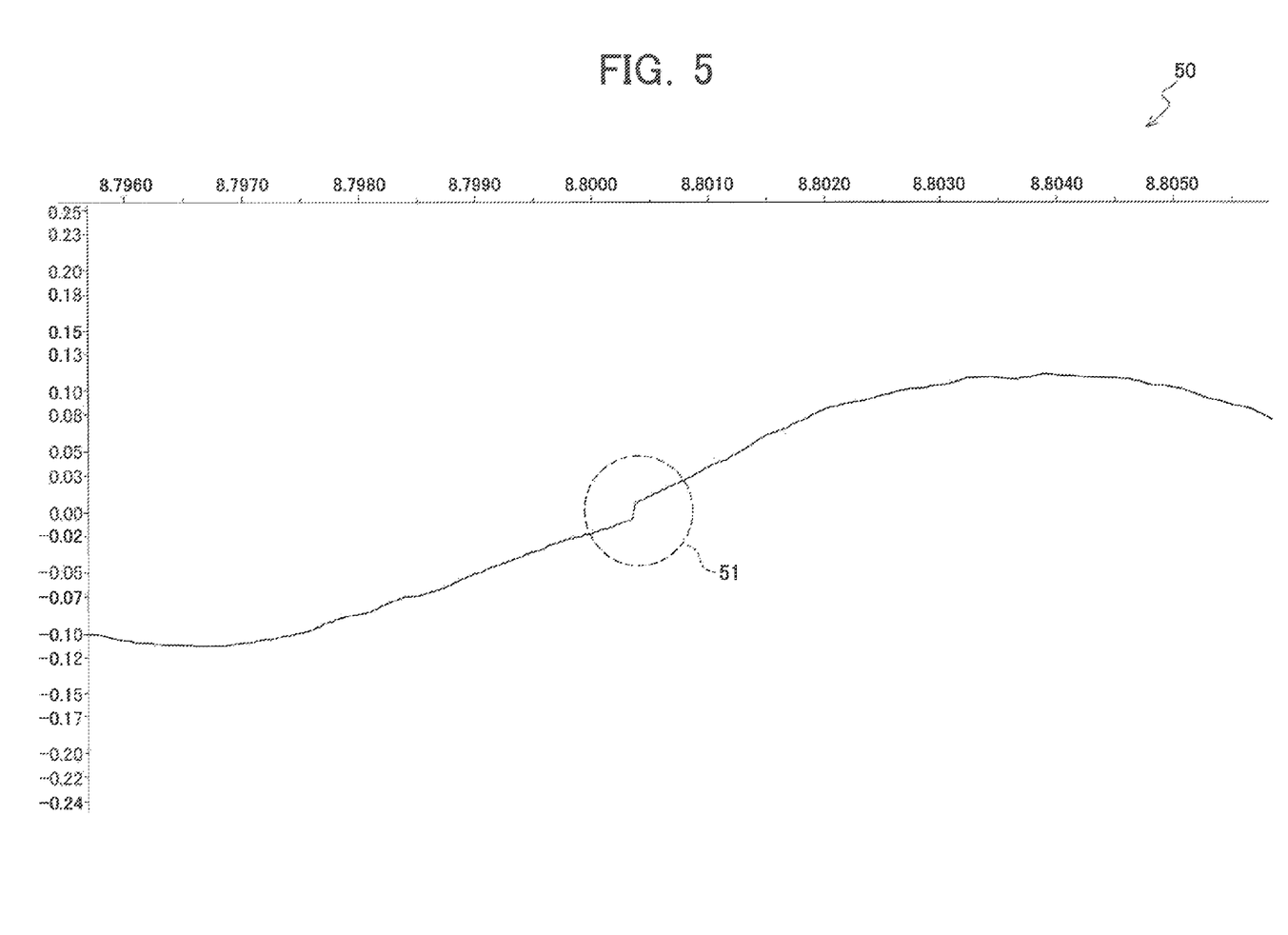
FIG. 5 is a diagram in which a part of a waveform of an audio signal which is input to a postprocessing portion of FIG. 2 is enlarged.

Next, description will be given for the postprocessing portion 28. The postprocessing portion 28 performs noise removal processing. Description will be given for noise intended for noise removal with reference to FIG. 5. FIG. 5 is a diagram in which a part of a waveform of an audio signal which is input to the postprocessing portion 28 of FIG. 2 is enlarged. An audio signal 50 shown in FIG. 5 has discontinuous points generated as shown in a vicinity of center 51. A number of such discontinuous points are included in data which is input to the postprocessing portion 28 through the signal separation and extraction portion 23, so that they are perceived as abrasive noise at the time of reproduction. Such a discontinuous point is generated because in the audio signal processing system, processing is performed in disregard of a direct current component, that is, a line spectrum of the direct current component is not considered.

Figure 6:
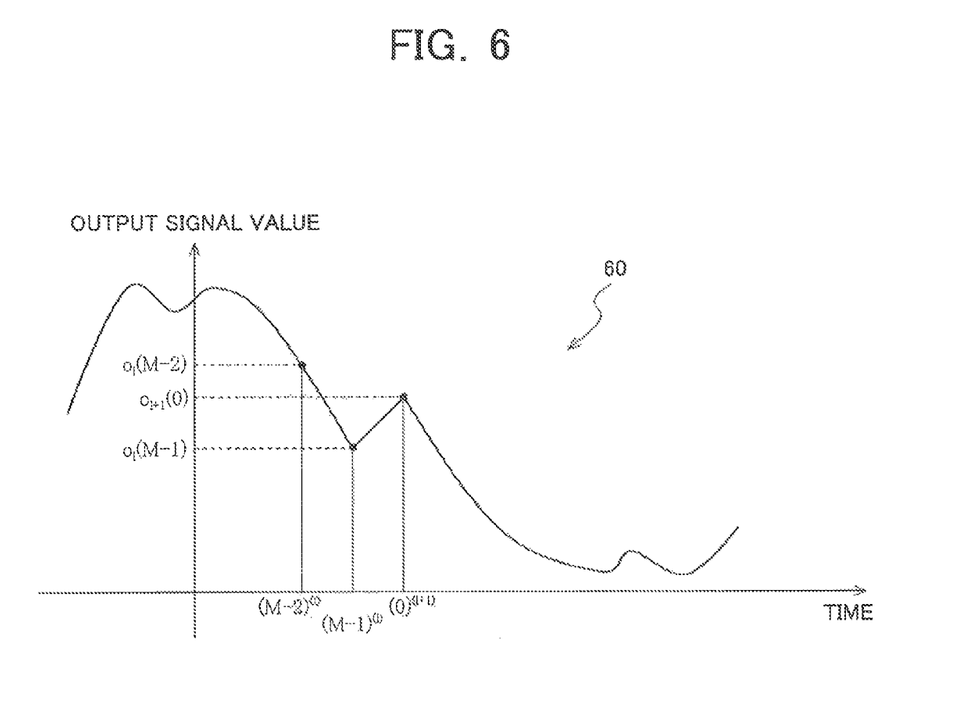
FIG. 6 is a schematic diagram for describing a discontinuous point of a waveform which is generated on a segment boundary after discrete Fourier inverse transform in a case where audio signals of right and left channels are subjected to discrete Fourier transform and direct current components of the right and left channels are disregarded.

FIG. 6 is a graph of a waveform schematically illustrating the description above. More specifically, FIG. 6 is a schematic diagram for describing a discontinuous point of a waveform which is generated on a segment boundary after discrete Fourier inverse transform in a case where audio signals of right and left channels are subjected to discrete Fourier transform and direct current components of the right and left channels are disregarded. In a graph 60 shown in FIG. 6, time is indicated on an abscissa axis, and for example, a sign $(M-2)^{(l)}$ indicates an M-2-th sample point of an l-th segment. An output signal value for the sample points is indicated on an ordinate axis of the graph 60. As can be seen from the graph 60, the discontinuous point is generated in a part from the end of the l-th segment and the beginning of the (l+1)-th segment.

Figure 7:
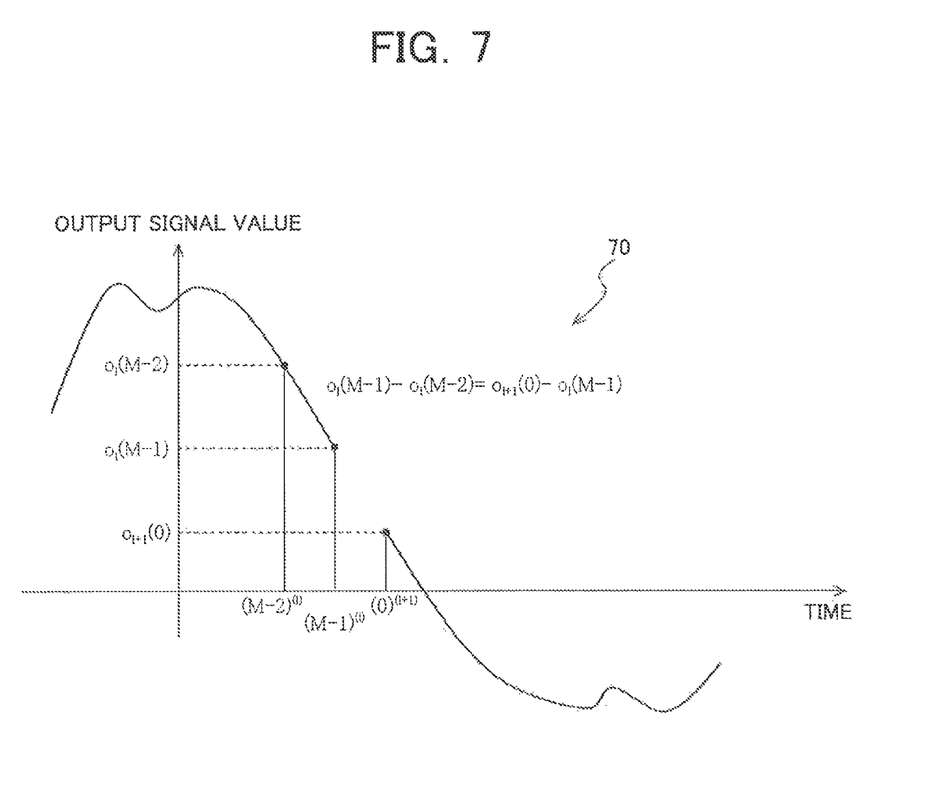
FIG. 7 is a schematic diagram for explaining an example of discontinuous point removal processing which is applied in the postprocessing portion of FIG. 2.
Figure 8:
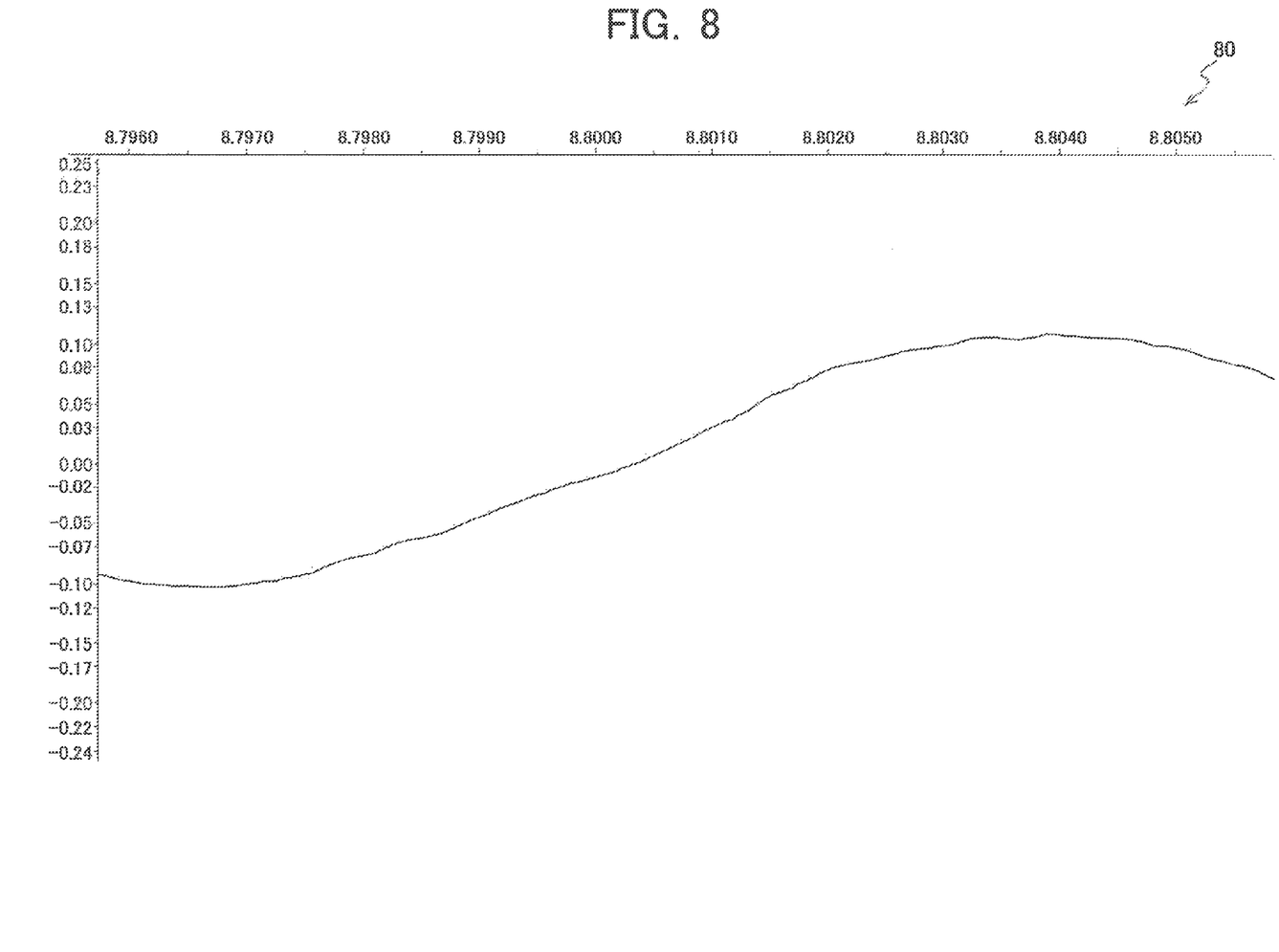
FIG. 8 is a diagram illustrating a result of applying the discontinuous point removal processing of FIG. 7 to the audio signal of FIG. 5.

Noise removal processing is performed against this problem. This processing may be provided by any method as long as noise is able to be removed by eliminating a discontinuous point in a waveform, and in this case, description will be specifically given for an example of such processing in order to solve the problem as described in FIG. 6 with reference to FIG. 7 and FIG. 8. FIG. 7 is a schematic diagram for explaining an example of discontinuous point removal processing which is applied in the postprocessing portion 28 of FIG. 2, and a schematic diagram for describing a method of removing a discontinuous point in a waveform which is generated on a segment boundary after discrete Fourier inverse transform in a case where audio signals of right and left channels are subjected to discrete Fourier transform and direct current components of the right and left channels are disregarded. Additionally, FIG. 8 is a diagram illustrating a result of applying the discontinuous point removal processing of FIG. 7 to the audio signal of FIG. 5.

In an example of the discontinuous point removal processing which is applied at the postprocessing portion 28, as a graph 70 of FIG. 7 shows a removal example for the graph 60 of FIG. 6, a derivative value in the last waveform in the l-th segment is conformed to a leading derivative value in the (l+1)-th segment. Specifically, the postprocessing portion 28 adds a direct current component (bias) to the waveform in the (l+1)-th segment so as to have a leading value in the (l+1)-th segment such that an inclination by the last two points in the l-th segment is maintained. Consequently, an output audio signal $y''_j(m)$ after processing is represented as:

$$y''_j(m)=y'_j(m)+B \quad (36)$$

B is a constant representing bias, and determined so as to have a continuous waveform as shown in the graph 70 of FIG. 7 after the last output audio signal and an output audio signal in current processing are added in an output buffer.

In this manner, it is preferable that the postprocessing portion 28 removes the discontinuous point by adding a direct current component to an audio signal after discrete Fourier inverse transform so that a derivative value in a waveform is maintained on a processing segment boundary. Note that, although a negative bias is applied in this example, there is also a case where a positive bias is applied for having the above-described derivative values conformed to one another, of course. In addition, as exemplified in each of the formulas, an audio signal after discrete Fourier inverse transform to be processed at the postprocessing portion 28 is an audio signal after the scaling processing in which uncorrelated signals are subjected to scaling processing in a time domain or a frequency domain. That is, scaling processing is applied to uncorrelated signals, and a discontinuous point is removed for the uncorrelated signals after the scaling processing.

Moreover, only with the discontinuous point removal processing as described in FIG. 7, bias components are accumulated so that amplitude in the waveform overflows in some cases.

Accordingly, as shown in the following formula, the size of amplitude of a bias component (direct current component) to be added is preferably reduced temporally for convergence. Note that, "reduce temporally" has a meaning of reduction proportionate to elapsed time from the time of addition, for example, elapsed time from a starting point for each processing segment or a starting point of a discontinuous point.

$$y''_j(m)=y'_j(m)+B \times ((M-m\sigma)/M) \quad (37)$$

However, σ is a parameter to adjust a degree of the reduction and assumed to be 0.5, for example. Note that, for reduction, both B and σ are assumingly positive. Further, when an absolute value of a bias value obtained for addition becomes equal to or more than a certain value, σ may be dynamically increased or decreased according to the value. Timing for increasing or decreasing may be in the next processing segment. The timing is not limited thereto, and when σ corresponding to a proportionality constant for reduction is set to be changed (varied) according to an absolute value of a bias value (size of amplitude of a direct current component), a feedback function works so that the similar effect is obtained. However, these methods do not guarantee that amplitude of an audio waveform does not overflow.

Thus, when a bias value becomes equal to or more than a certain value (predetermined value), for example, processing so that a bias term of a second term of the formula (37) is not added may be added as a safeguard function. That is, the postprocessing portion 28 preferably executes addition of a direct current component (executes removal of a discontinuous point) only when amplitude of a direct current component obtained for addition is less than a predetermined value. Bias components are not accumulated by employing this method.

Moreover, when an audio signal is close to a white noise like a consonant part of sound, for example, an audio signal waveform is significantly changed so that an original waveform already becomes a nearly discontinuous condition in some cases. When the above-described discontinuous point removal processing is applied to such an audio signal, a waveform is distorted conversely in some cases. In other words, when the above-described discontinuous point removal processing is applied to the audio signal with an original waveform in a nearly discontinuous condition, this processing attempts to force a waveform which is originally close to be discontinuous to be continued, and thus there is possibility to distort the waveform on the contrary.

To solve this problem, the postprocessing portion 28 preferably performs discontinuous point removal processing (noise removal processing) by a method described as follows. In the method, when a signal is close to a white noise like a consonant part of sound, extremely increased number of times of intersection of an waveform of an input audio signal at 0, compared to the other parts, within a predetermined time (within a processing segment or within a half thereof, for example) is used. Note that, it is only required to determine arbitrarily where 0 is placed. Therefore, when the number of times of intersection of output audio signals (at least an audio signal after discrete Fourier inverse transform) at 0 in a half-segment length is counted and equal to or more than a certain value (predetermined number of times), the next segment is regarded as a part in which the number of times is more than the predetermined number of times, so that a bias term of a second term on a right side in the formula (36) or the formula (37) is not assumingly added in the next segment processing. In other words, the discontinuous point removal processing is executed only in the other parts. Note that, counting may be executed for an audio waveform in a certain time irrespective of a segment boundary, or may be executed for an audio waveform for a plurality of segment processing, and in both cases, whether or not to add a bias term in the next segment processing may be determined based on the counting result.

It can be seen that a part of a discontinuous point (vicinity of center 51) in the audio signal 50 of FIG. 5 becomes continuous because the noise removal processing as described above eliminates the discontinuous point as shown by an audio signal 80 of FIG. 8. In this manner, it is possible to eliminate a discontinuous point and remove a noise.

Moreover, in a broadcasting content or a music content, an uncorrelated signal which is extracted by using the present invention is normally a reverberation sound or a background sound component in many cases. Such characteristic is utilized to, as described above, raise an extraction level of an uncorrelated signal relatively higher than an extraction level of a correlated signal, thereby making it possible to emphasize cheering from spectators in a sport program, for example, enhance the sense of presence to view the program. This adjustment method is installed on a television as one of preset functions, thereby making it possible to add a function to enhance the sense of presence to the television. Additionally, a level of an uncorrelated signal may be controlled so as to increase or decrease pressure according to a position of a control shifted in a horizontal direction by a remote control operation.

As described above, according to the present invention, it becomes possible to separate audio signal components for enhancing the sense of presence from audio signals of two channels included in audio or musical sound content recorded in stereo and decrease or increase pressure. Further, uncorrelated signals are increased and/or decreased, thereby making it possible to enhance the sense of presence of a broadcasting content or a music content according to user's preference.

Description has hereinbefore been given for processing in the audio signal processing device according to the present invention, and next, description will be given for an application example which is further applicable to each of the above-described examples.

In each of the above-described examples, although description has been given assuming that an audio signal subjected to increasing pressure or suppression is reproduced only by right and left speakers according to the present invention in this manner, it is preferable to reproduce in a wavefront synthesis reproduction system capable of obtaining a sweet spot broader than that of a multichannel reproduction system since an effect of increasing pressure or suppression is not limited to a small listening area but to be broader. Note that, the wavefront synthesis reproduction system is a reproduction system in which wavefront of sound is synthesized by a speaker group which is arranged in a line or a plane, and for example, the Wave Field Synthesis (WFS) system has been actively studied in recent years as one of a realistic implementation methods using a speaker group (speaker array) linearly arranged. A listener who is listening to sound, facing a speaker array in sound space provided by the WFS system feels as if sound which is actually radiated from the speaker array is radiated from a sound source virtually existing behind the speaker array (virtual sound source). Accordingly, in such a system, it is possible to enjoy an effect of increasing pressure or suppression according to the present invention in a broad listening area, and for example, a plurality of listeners who horizontally line are able to enjoy the effect of increasing pressure or suppression at the same time. Audio signal processing according to the present invention is basically the same, whether to be reproduced in the multichannel reproduction system or reproduced in the wavefront synthesis reproduction system.

In each of the above-described examples, regarding the audio signal processing according to the present invention, description has been given for only the case where an input audio signal is a 2 ch audio signal, that is, a content recorded in stereo, however, it is also applicable to a multichannel audio signal having more channels. Popular systems other than a stereo system include 5.1 ch, 7.1 ch, 9.1 ch, and 22.2 ch systems, and the like. All of these systems are also systems for generating a synthesized sound image by combining a plurality of speakers, and thus pressure increase processing or suppression processing of uncorrelated signals according to the present invention is applicable.

Specifically describing application to a multichannel audio signal, two channels to be focused are selected, and for the two of which, pressure increase processing or suppression processing as described above is performed. In these systems, highly correlated signals are allocated between a left channel and a right channel in front in many cases, and thus, in order to emphasize or obscure the correlation, the suppression processing or pressure increase processing according to the present invention is applied to the left channel and the right channel in front for outputting, then for a center channel in front, output may be directly performed (gain adjustment may be performed also in this case).

Additionally, in the case of an input audio signal of 5.1 ch, for example, it is possible to extract a sound source only from two right and left channels in front for outputting uncorrelated signals increased or decreased while extracting a sound source only from two right and left channels at the back for outputting uncorrelated signals increased or decreased, and output may be directly performed for the center channel.

Moreover, in each of the above-described examples, an example of performing separation of uncorrelated signals in discrete Fourier space has been described, however, not limited thereto, only the separation is needed to be allowed for the present invention. A main characteristic of the present invention is to extract uncorrelated signals to increase or decrease the uncorrelated signals, thereby increasing or suppressing pressure.

Next, description will be given for implementation of the audio signal processing device according to the present invention.

An audio signal processing device according to the present invention is usable for an audio data reproduction apparatus or a device with an audio data reproduction apparatus including a personal computer (PC), an optical disk reproduction device, a mobile information terminal with a music reproduction function, a television apparatus, a projector, or a small device dedicated to audio processing. An input device is a mouse or the like for the PC, and a button operation, a touchpad or the like for the mobile information device. Additionally, the optical disk reproduction device or the small device dedicated to processing may be operated with a button installed on a body, or with a remote controller or the like while outputting a GUI screen on a display device such as a monitor apparatus or a television apparatus. Additionally, this audio data reproduction apparatus may not only be able to be configured as a device processing sound only, but also incorporated into a device with a video image as exemplified by the television apparatus, the projector, or the like.

Moreover, for example, it is possible to realize each component of the audio signal processing device according to the present invention and each component of the audio data reproduction apparatus provided with the device, including each component in the audio signal processing portion 20 as exemplified in FIG. 2, by hardware such as a microprocessor (or a DSP: Digital Signal Processor), a memory, a bus, an interface, and a peripheral device, and software which is executable on the hardware. It is possible to mount a part or all of the above-described hardware as an integrated circuit/IC (Integrated Circuit) chip set, and in this case, the above-described software may be stored on the above-described memory. Moreover, all of the components of the present invention may be configured by hardware, and also in this case, it is similarly possible to mount a part or all of the hardware as an integrated circuit/IC chip set.

In addition, it is possible to achieve an object of the present invention even by supplying a recording medium having a program code of software recorded thereon for realizing functions in a variety of configuration examples described above to a device including a general purpose computer as an audio signal processing device for executing the program code by a microprocessor or a DSP in the device. In this case, the program code itself of software realizes functions in a variety of configuration examples described above, so that even the program code itself or a recording medium (external recording medium or internal storage device) having the program code recorded thereon is able to constitute the present invention by reading and executing the code on a control side. The external recording medium includes a variety of media such as an optical disk including a CD-ROM, a DVD-ROM, or the like, and a non-volatile semiconductor memory including a memory card or the like, for example. The internal storage device includes a variety of devices such as a hard disk, a semiconductor memory, or the like. Moreover, the program code is also able to be executed by downloading from the Internet or executed by receiving from a broadcast wave.

Description has hereinbefore been given for the audio signal processing device according to the present invention, and as a process flow has been described, the present invention may also employ a form as an audio signal processing method for increasing or decreasing uncorrelated signals of two channels. This audio signal processing method is comprised of an extraction step, an increase/decrease step, and an addition step as follows. The extraction step is a step in which a signal extraction portion extracts uncorrelated signals from among input audio signals of two channels. The increase/decrease step is a step in which an uncorrelated signal increase/decrease portion increases or decreases the uncorrelated signals extracted at the extraction step. The addition step is a step in which an audio signal addition portion adds the signals increased or decreased at the increase/decrease step to the input audio signal. The other application examples are as described for the audio signal processing device, which description is thus omitted.

Note that, the above-described program code itself is, in other words, a program for causing a computer to execute the audio signal processing method. That is, the program is a program for causing a computer to execute an extraction step of extracting uncorrelated signals from among input audio signals of two channels, an increase/decrease step of increasing or decreasing the uncorrelated signals extracted at the extraction step, and an addition step of adding the signals increased or decreased at the increase/decrease step to the input audio signal. The other application examples are as described for the audio signal processing device, which description is thus omitted.

EXPLANATIONS OF LETTERS OR NUMERALS

10 . . . audio data reproduction apparatus; 11 . . . decoder; 12 . . . audio signal extraction portion; 13, 20 . . . audio signal processing portion; 14 . . . D/A converter; 15 . . . amplifier; 16 . . . speaker; 17 . . . parameter control portion; 18 . . . user interface control portion; 19a . . . display device; 19b . . . input device; 21 . . . preprocessing portion; 22 . . . discrete Fourier transform portion; 23 . . . signal separation and extraction portion; 25a, 25b . . . gain adjustment portion; 26 . . . synthesizing portion; 27 . . . discrete Fourier inverse transform portion; and 28 . . . postprocessing portion.

The invention claimed is:

1. An audio signal processing device for increasing or decreasing uncorrelated signals of two channels, comprising:
   a signal extractor configured to extract correlated signals for frequencies between signals from among input audio signals of two channels, to extract uncorrelated signals of one channel by subtracting the correlated signals from input audio signals of the one channel, and to extract uncorrelated signals of another channel by subtracting a value obtained by multiplying the correlated signals by a positive real number that indicates a degree of sound pressure balance of two channels from input audio signals of the another channel;
   an uncorrelated signal increaser/decreaser configured to increase or decrease the uncorrelated signals of each channel extracted at the signal extractor; and
   an audio signal adder configured to add the signals increased or decreased at the uncorrelated signal increaser/decreaser portion to the input audio signal of each channel.

2. The audio signal processing device as defined in claim 1, further comprising:
   a user interface configured to receive a user operation which changes a degree of increase or decrease at the uncorrelated signal increaser/decreaser; and
   a parameter controller configured to change a parameter which indicates the degree of increase or decrease according to the user operation received in the user interface.

3. The audio signal processing device as defined in claim 2, wherein
   the user interface represents the degree of decrease at the uncorrelated signal increaser/decreaser by a negative value while representing the degree of increase by a positive value.

4. An audio signal processing method for increasing or decreasing uncorrelated signals of two channels, comprising:
- an extraction step of extracting correlated signals for frequencies between signals from among the input audio signals of two channels, extracting uncorrelated signals of one channel by subtracting the correlated signals from input audio signals of the one channel, and extracting uncorrelated signals of another channel by subtracting a value obtained by multiplying the correlated signals by a positive real number that indicates a degree of sound pressure balance of two channels from input audio signals of the another channel, by a signal extractor;
- an increase/decrease step of increasing or decreasing the uncorrelated signals of each channel extracted at the extraction step, by an uncorrelated signal increaser/decreaser; and
- an addition step of adding the signals increased or decreased at the increase/decrease step to the input audio signal of each channel, by an audio signal adder.

5. A non-transitory computer-readable recording medium having a program recorded thereon to cause a computer to execute:
- an extraction step of extracting correlated signals for frequencies between signals from among input audio signals of two channels, extracting uncorrelated signals of one channel by subtracting the correlated signals from input audio signals of the one channel, and extracting uncorrelated signals of another channel by subtracting a value obtained by multiplying the correlated signals by a positive real number that indicates a degree of sound pressure balance of two channels from input audio signals of the another channel;
- an increase/decrease step of increasing or decreasing the uncorrelated signals of each channel extracted at the extraction step; and
- an addition step of adding the signals increased or decreased at the increase/decrease step to the input audio signal of each channel.

\* \* \* \* \*